(12) United States Patent
Asada et al.

(10) Patent No.: US 6,553,535 B1
(45) Date of Patent: Apr. 22, 2003

(54) POWER-EFFICIENT COMMUNICATION PROTOCOL

(75) Inventors: Haruhiko H. Asada, Concord, MA (US); Cem Erin, Cambridge, MA (US); Kai-Yeung Siu, Charlestown, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 09/378,411

(22) Filed: Aug. 20, 1999

Related U.S. Application Data

(60) Provisional application No. 60/097,460, filed on Aug. 21, 1998, now abandoned.

(51) Int. Cl.[7] .................. G11C 29/00; H03M 13/00; H03M 13/03
(52) U.S. Cl. .................. 714/777; 714/783; 375/269
(58) Field of Search .................. 714/704, 792, 714/253, 777, 783; 375/265

(56) References Cited

U.S. PATENT DOCUMENTS

| | | | |
|---|---|---|---|
| 4,077,021 A | 2/1978 | Csajka et al. ............. 332/9 R |
| 4,396,906 A | 8/1983 | Weaver ............. 340/347 DD |
| 4,513,403 A | 4/1985 | Troy ............. 367/83 |
| 4,562,426 A | 12/1985 | Forney, Jr. ............. 340/347 DD |
| 4,630,288 A | 12/1986 | Longstaff et al. ............. 375/261 |
| 4,733,401 A | 3/1988 | Longstaff ............. 375/37 |
| RE33,056 E | 9/1989 | Forney, Jr. et al. ............. 375/39 |
| 4,882,733 A | 11/1989 | Tanner ............. 371/43 |
| 4,907,278 A | * 3/1990 | Cecinati et al. ............. 704/246 |
| 4,922,507 A | * 5/1990 | Simon et al. ............. 375/254 |
| 5,062,152 A | 10/1991 | Faulkner ............. 359/185 |
| 5,363,407 A | * 11/1994 | Ramesh et al. ............. 375/254 |
| 5,533,062 A | * 7/1996 | Liberti et al. ............. 375/334 |
| 5,559,561 A | * 9/1996 | Wei ............. 348/470 |
| 5,615,226 A | * 3/1997 | Lipa ............. 375/147 |
| 5,689,248 A | 11/1997 | Esfahani et al. ............. 340/853.1 |
| 5,748,103 A | 5/1998 | Flach et al. ............. 340/870.07 |
| 5,832,026 A | * 11/1998 | Li ............. 375/136 |
| 5,832,044 A | * 11/1998 | Sousa et al. ............. 375/347 |
| 5,903,676 A | * 5/1999 | Wu et al. ............. 382/244 |
| 5,964,701 A | 10/1999 | Asada et al. ............. 600/300 |
| 6,081,555 A | * 6/2000 | Olafsson ............. 375/242 |
| 6,118,826 A | * 9/2000 | Zehavi et al. ............. 375/261 |
| 6,157,678 A | * 12/2000 | Wei ............. 375/243 |

FOREIGN PATENT DOCUMENTS

| | | |
|---|---|---|
| DE | 197 48 880 C 1 | 5/1999 |
| EP | 0 852 438 A2 | 7/1998 |
| WO | WO 94/16769 | 8/1994 |
| WO | WO 99/19790 | 4/1999 |

OTHER PUBLICATIONS

Stephen B. Wicker, "Error Control Systems for Digital Communication and Storage", Prentice–Hall, 1995.*

Nilo Casimiro Ericsson, "Adaptive Modulation and Scheduling for Fading Channels", Global Telecommunications Conference—Globecom '99.*

(List continued on next page.)

Primary Examiner—Albert Decady
Assistant Examiner—Joseph D. Torres
(74) Attorney, Agent, or Firm—Bromberg & Sunstein LLP

(57) ABSTRACT

A method and apparatus for telemetering data on a channel having a maximum data rate by utilizing a power efficient communication protocol is provided. The data to be telemetered comprises a number of source symbols where each source symbol is characterized by a probability of occurrence. A sequence of signals forming codewords having an energy and a length is produced. The length for the codewords is based at least on the number of symbols to be coded. Each codeword signifies a specified source symbol on the basis of a mapping between source symbols and codewords. The mapping is such that each source symbol of lower probability of occurrence is associated with a codeword of at least equal energy.

48 Claims, 13 Drawing Sheets

OTHER PUBLICATIONS

Agrawal, P., et al., "An Adaptive Power Control and Coding Scheme for Mobile Radio Systems," IEEE, pp. 283–288, 1986.

Ayanoglu, Ender, et al., "Airmail: A Link–Layer Protocol for Wireless Networks," Wireless Networks, pp. 47–60, 1995.

Bambos, Nicholas, "Toward Power–Sensitive Network Architectures in Wireless Communications: Concepts, Issues, and Design Aspects,", IEEE Personal Communications, pp. 50–59, Jun. 1998.

Biglieri, Ezio, et al., "Coding and Modulation Under Power Constraints," IEEE Personal Communications, pp. 32–39, Jun. 1998.

Campopiano, C.N., "A Coherent Digital Amplitude and Phase Modulation Scheme," IRE Transactions on Communications Systems, pp. 90–95, Mar. 1961.

Forney, Jr., David G., et al., "Efficient Modulation for Brand–Limited Channels," IEEE Journal on Selected Areas in Communications, vol. SAC–2, No. 5, pp. 632–647, Sep. 1984.

Imai, Hideki, "A New Multilevel Coding Method Using Error–Correcting Codes," IEEE Transactions on Information Theory, vol. IT–23, No. 3, pp. 371–377, May 1977.

Lang, Gordon R., et al., "A Leech Lattice Modem," IEEE Journal on Selected Areas in Communications, vol. 7, No. 6, pp. 968–973, Aug. 1989.

Lettieri, Paul, et al., "Low Power Error Control for Wireless Links," Mobicom 97 Budapest Hungary, pp. 139–150, 1997.

Ma, Howard H., "On Tail Biting Convolutional Codes," IEEE Transactions on Communications, vol. COM–34, No. 2, pp. 104–111, Feb. 1986.

Sayegh, Soheil I., "A Class of Optimum Block Codes in Signal Space," IEEE Transactions on Communications, vol. COM–34, No. 10, pp. 1043–1045, Oct. 1986.

Ungerboeck, Gottfried, "Channel Coding with Multilevel/Phase Signals," IEEE Transactions on Information Theory, vol. IT–28, No. 1., pp. 55–67, Jan. 1982.

Ungerboeck, Gottfried, "Trellis–Coded Modulation with Redundant Signal Sets Part I: Introduction", IEEE Communications Magazine, vol. 25, No. 2, pp 5–11, Feb. 1987.

Ungerboeck, Gottfried, "Trellis–Coded Modulation with Redundant Signal Sets Part II: State of the Art," IEEE Communications Magazine, vol. 25, No. 2, pp. 12–21, Feb. 1987.

Zorzi, Michele, et al., "Energy–Constrained Error Control for Wireless Channels," IEEE Personal Communications, pp. 27–33, Dec. 1997.

Glen G. Langdon, Jr., "An Introduction to Arithmetic Coding" IBM Res. Develop. vol. 28, No. 2 Mar. 1984, pp. 135–149 XP–002086019.

W.B. Pennebaker, et al., "An Overview of the Basic Principles of the Q–coder Adaptive Binary Arithmetic Coder" IBM Journal of Research and Development, vol. 32, No. 6, Nov. 1988, pp. 717–726 XP 000111384.

* cited by examiner

| SYMBOLS | CODEWORDS |
|---|---|
| P{.30} → | 0000 |
| P{.15} → | 0001 |
| P{.10} → | 0010 |
| P{.08} → | 0100 |
| P{.07} → | 1000 |
| P{.06} → | 0011 |
| P{.05} → | 0101 |
| P{.04} → | 0110 |
| P{.03} → | 1100 |
| P{.025} → | 1001 |
| P{.024} → | 1010 |
| P{.023} → | 1011 |
| P{.023} → | 1101 |
| P{.015} → | 0111 |
| P{.010} → | 1110 |
| P{.000} → | 1111 |

FIG. 7

FIG. 10  TABLE 1: MULTILEVEL ME CODING

| NUMBER | SYMB. SEQ. | POWER | CODEWORD | MESSAGE |
|---|---|---|---|---|
| 1 | $s_0 s_0$ | $(1^2+1^2)+(1^2+1^2)=4$ | 0000 0000 | $m_1$ |
| 2 | $s_0 s_1$ | $(1^2+1^2)+(1^2+1^2)=4$ | 0000 0001 | $m_2$ |
| 3 | $s_0 s_2$ | $(1^2+1^2)+(1^2+1^2)=4$ | 0000 0010 | $m_3$ |
| 4 | $s_0 s_3$ | $(1^2+1^2)+(1^2+1^2)=4$ | 0000 0011 | $m_4$ |
| 5 | $s_1 s_0$ | $(1^2+1^2)+(1^2+1^2)=4$ | 0001 0000 | $m_5$ |
| 6 | $s_1 s_1$ | $(1^2+1^2)+(1^2+1^2)=4$ | 0001 0001 | $m_6$ |
| 7 | $s_1 s_2$ | $(1^2+1^2)+(1^2+1^2)=4$ | 0001 0010 | $m_7$ |
| 8 | $s_1 s_3$ | $(1^2+1^2)+(1^2+1^2)=4$ | 0001 0011 | $m_8$ |
| 9 | $s_2 s_0$ | $(1^2+1^2)+(1^2+1^2)=4$ | 0010 0000 | $m_9$ |
| 10 | $s_2 s_1$ | $(1^2+1^2)+(1^2+1^2)=4$ | 0010 0001 | $m_{10}$ |
| 11 | $s_2 s_2$ | $(1^2+1^2)+(1^2+1^2)=4$ | 0010 0010 | $m_{11}$ |
| 12 | $s_2 s_3$ | $(1^2+1^2)+(1^2+1^2)=4$ | 0010 0011 | $m_{12}$ |
| 13 | $s_3 s_0$ | $(1^2+1^2)+(1^2+1^2)=4$ | 0011 0000 | $m_{13}$ |
| 14 | $s_3 s_1$ | $(1^2+1^2)+(1^2+1^2)=4$ | 0011 0001 | $m_{14}$ |
| 15 | $s_3 s_2$ | $(1^2+1^2)+(1^2+1^2)=4$ | 0011 0010 | $m_{15}$ |
| 16 | $s_3 s_3$ | $(1^2+1^2)+(1^2+1^2)=4$ | 0011 0011 | $m_{16}$ |
| 17 | $s_4 s_0$ | $(3^2+1^2)+(1^2+1^2)=12$ | 0100 0000 | $m_{17}$ |
| 18 | $s_4 s_1$ | $(3^2+1^2)+(1^2+1^2)=12$ | 0100 0001 | $m_{18}$ |
| 19 | $s_4 s_2$ | $(3^2+1^2)+(1^2+1^2)=12$ | 0100 0010 | $m_{19}$ |
| 20 | $s_4 s_3$ | $(3^2+1^2)+(1^2+1^2)=12$ | 0100 0011 | $m_{20}$ |
| 21 | $s_5 s_0$ | $(3^2+1^2)+(1^2+1^2)=12$ | 0101 0000 | $m_{21}$ |
| 22 | $s_5 s_1$ | $(3^2+1^2)+(1^2+1^2)=12$ | 0101 0001 | $m_{22}$ |
| 23 | $s_5 s_2$ | $(3^2+1^2)+(1^2+1^2)=12$ | 0101 0010 | $m_{23}$ |
| 24 | $s_5 s_3$ | $(3^2+1^2)+(1^2+1^2)=12$ | 0101 0011 | $m_{24}$ |
| 25 | $s_6 s_0$ | $(3^2+1^2)+(1^2+1^2)=12$ | 0110 0000 | $m_{25}$ |
| 26 | $s_6 s_1$ | $(3^2+1^2)+(1^2+1^2)=12$ | 0110 0001 | $m_{26}$ |
| 27 | $s_6 s_2$ | $(3^2+1^2)+(1^2+1^2)=12$ | 0110 0010 | $m_{27}$ |
| 28 | $s_6 s_3$ | $(3^2+1^2)+(1^2+1^2)=12$ | 0110 0011 | $m_{28}$ |
| 29 | $s_7 s_0$ | $(3^2+1^2)+(1^2+1^2)=12$ | 0111 0000 | $m_{29}$ |
| 30 | $s_7 s_1$ | $(3^2+1^2)+(1^2+1^2)=12$ | 0111 0001 | $m_{30}$ |
| 31 | $s_7 s_2$ | $(3^2+1^2)+(1^2+1^2)=12$ | 0111 0010 | $m_{31}$ |
| 32 | $s_7 s_3$ | $(3^2+1^2)+(1^2+1^2)=12$ | 0111 0011 | $m_{32}$ |
| 33 | $s_8 s_0$ | $(3^2+1^2)+(1^2+1^2)=12$ | 1000 0000 | $m_{33}$ |
| 34 | $s_8 s_1$ | $(3^2+1^2)+(1^2+1^2)=12$ | 1000 0001 | $m_{34}$ |
| 35 | $s_8 s_2$ | $(3^2+1^2)+(1^2+1^2)=12$ | 1000 0010 | $m_{35}$ |
| 36 | $s_8 s_3$ | $(3^2+1^2)+(1^2+1^2)=12$ | 1000 0011 | $m_{36}$ |
| 37 | $s_9 s_0$ | $(3^2+1^2)+(1^2+1^2)=12$ | 1001 0000 | $m_{37}$ |
| 38 | $s_9 s_1$ | $(3^2+1^2)+(1^2+1^2)=12$ | 1001 0001 | $m_{38}$ |
| 39 | $s_9 s_2$ | $(3^2+1^2)+(1^2+1^2)=12$ | 1001 0010 | $m_{39}$ |
| 40 | $s_9 s_3$ | $(3^2+1^2)+(1^2+1^2)=12$ | 1001 0011 | $m_{40}$ |

POWER-EFFICIENT COMMUNICATION PROTOCOL

PRIORITY

This application claims priority from United States provisional patent application Ser. No. 60/097,460, filed Aug. 21, 1998 expired, entieled "POWER-EFFICIENT CODING PROTOCOL" the disclosure of which is incorporated herein, in its entirety, by reference.

TECHNICAL FIELD

The present invention pertains to a symbol encoding method and apparatus optimized for energy efficient transmission.

BACKGROUND

Coding and modulation refers to the mapping of information into a representation, or code, suitable for transmission on a channel. Measures for rating the performance of a coding protocol include: transmission rate, error probability, and power consumption. Since these criteria exhibit conflicting objectives, their application results in performance tradeoffs. Communications systems typically aim to maximize transmission rate, while keeping error probability and power consumption below specified thresholds. For wireless communication applications, however, minimization of power consumption is highly desirable in order to extend battery lifetimes. And, indeed, the overall power consumption of a wireless communication system is driven by transmitter operation which is, in turn, controlled by the communication protocol.

SUMMARY OF THE INVENTION

In accordance with one aspect of the invention, a method for telemetering data on a channel having a maximum data rate by utilizing a power efficient communication protocol is provided. The data to be telemetered comprises a number of source symbols where each source symbol is characterized by a probability of occurrence. A sequence of signals forming codewords having an energy and a length is produced. The length for the codewords is based at least on the number of symbols to be coded. Each codeword signifies a specified source symbol on the basis of a mapping between source symbols and codewords. The mapping is such that each source symbol of lower probability of occurrence is associated with a codeword of at least equal energy. In a related embodiment, the codeword length is also determined based on the maximum data rate of the channel. In another related embodiment the codewords and source symbols may be concatenated to provide an increase in power efficiency.

In yet another embodiment of the invention, the power efficent communication protocol may be combined with other coding schemes. The codewords are first constructed based upon the chosen coding scheme. Examples of coding schemes are turbo coding, trellis coding, lattice coding, error correction coding, multi-level modulation and block-coded modulation. The length of the codewords is constrained by the number of symbols and a given transmission rate for the channel. A mapping is then producing between the source symbols and codewords mapped such that each symbol of lower probability of occurrence is associated with a codeword of at least equal energy.

In another embodiment of the invention an apparatus for implementing the power efficient communication protocol is provided. The apparatus includes an encoder for converting source symbols to codewords on the basis of a mapping between source symbols and codewords. The length of the codewords is determined in part on the number of source symbols and the number of source symbols per second to be transmitted. The mapping between the source symbols and the codewords is such that each symbol of lower probability of occurrence is associated with a codeword of at least equal energy. The apparatus further includes a transmitter for transmitting the codewords. The transmitter transmits the codewords imposed on a carrier wave to a receiver which demodulating the codewords provides the codewords to a computer or processor. The computer/processor is equipped to determine the source symbols corresponding to the codewords.

BRIEF DESCRIPTION OF THE DRAWINGS

The foregoing features of the invention will be more readily understood by reference to the following detailed description taken with the accompanying drawings:

FIG. 7 shows a table showing the power consumption of concatenated codewords.

FIG. 10 is a table of one example of the codewords for an uncoded multilevel modulation scheme.

DESCRIPTION OF PREFERRED EMBODIMENTS

Figure 1:
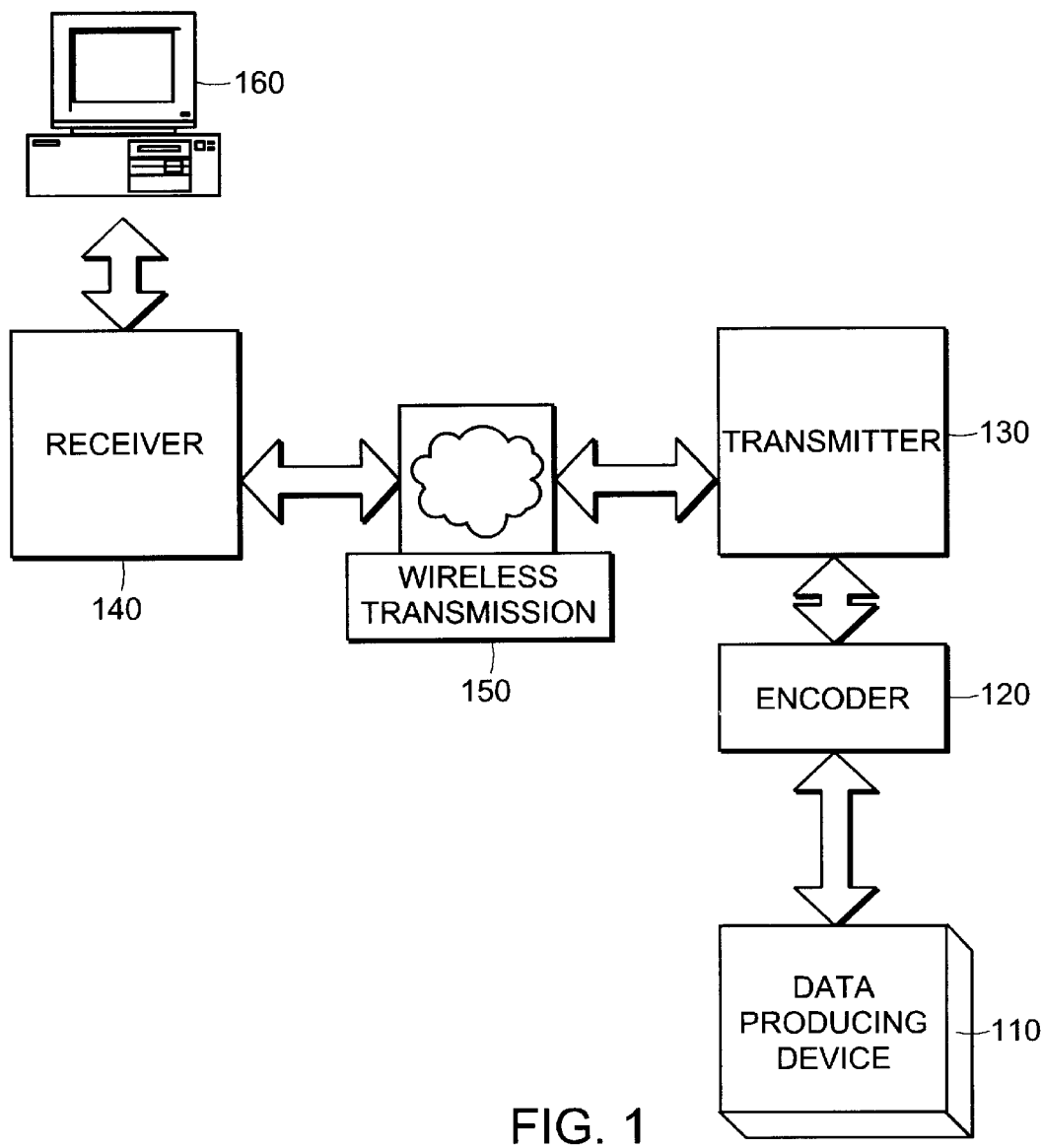
FIG. 1 is a network drawing showing an embodiment for use with the power efficient communication protocol.

In the following description and claims, the term "data" shall refer to both information and commands. The term "binary modulation" shall refer to any modulation scheme containing two signals of non-equal energy. FIG. 1 shows an exemplary system for implementing one embodiment of a power efficient communication protocol. The system includes a data producing device 110 which produces a data output. For example, a data producing device 110 may be a sensor which reads a real-world signal such as a heart rate or skin temperature and produces a digital signal which is representative of the heart rate or skin temperature. This sensor is described in U.S. patent application Ser. No. 08/954,889 entitled PATIENT MONITORING FINGER RING SENSOR filed on Oct. 8, 1997 and is incorporated herein by reference in its entirety.

The data output is passed to an encoder 120. The encoder 120 recognizes patterns within the data and associates the data with source symbols from an alphabet. In one implementation, the symbols are determined by accessing a look-up table that is associated with the encoder 120. The encoder 120 then maps the symbols based on known probabilities of occurrence for the symbols to a set of power-efficient codewords for transmission. This may be accomplished in the same look-up table as described above or in a separate look-up table. The encoder 120 passes the codewords to a transmitter 130 and the transmitter modulates the codewords onto a carrier wave and transmits the codewords to a receiver 140 through a wireless channel 150. The receiver 140 receives the carrier wave, demodulates the codewords and passes the codewords to a computer or processor 160. The computer decodes the codewords back into the original symbols through the use of an inverse look-up table. In an alternative embodiment, there is only one look-up table in the encoder as each parsed data sequence represents a symbol in the alphabet so that only one association is needed between the data sequence and the codewords. In other embodiments a further look-up table or mapping function is required for non-binary modulation schemes.

In other embodiments the data producing device 110, the encoder 120, and the transmitter 130 may reside within a wireless device such as a cellular phone. In such an embodiment, the data producing device might be an analog-to-digital converter receiving voice signals and converting the voice signals into a digital format. It should be obvious to one skilled in the art that other wireless devices where energy conservation is a design factor may incorporate the power efficient communication protocol.

Figure 1A:
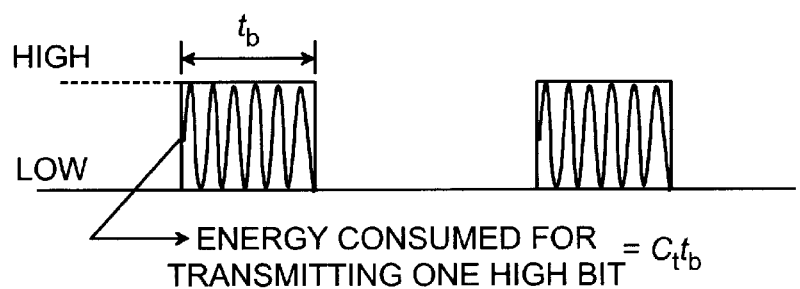
FIG. 1A is an example of data encoded in a digital binary modulation scheme.

In transmitting codewords via a transmitter, the transmitter expends energy. In a digital binary modulation scheme, such as, on-off keying, data is encoded as either ones or zeros where a one represents a high bit which requires more energy than a low bit or zero during transmission as shown in FIG. 1A. Therefore, the energy efficiency of codewords sent from a transmitter to a receiver is increased by reducing the average number of high bits provided in the codewords which are transmitted. It should be understood by those of ordinary skill in the art that a zero bit may be mapped to a higher energy signal for transmission than a one bit and therefore power consumption would be reduced by decreasing the number of zero bits.

Figures 2, 3:
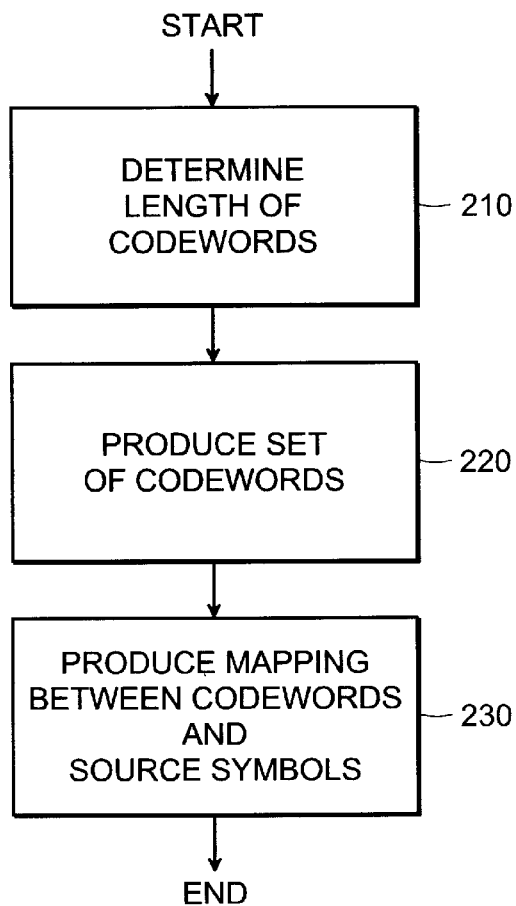
FIG. 2 is a flow chart of the steps in one embodiment of the power efficient communication protocol.
FIG. 3 shows an exemplary version of the mapping where the source symbols are placed in order of increasing probability while the codewords are placed in order of decreasing energy levels.

FIG. 2 shows the steps used in determining energy efficient codewords and associating the energy efficient codewords with symbols having predetermined probabilities in a digital binary modulation scheme. In this embodiment of the invention, the codewords are composed of signals which are sent during a fixed length interval and are each of equal duration. It should be apparent that non-equal duration signals would work with this embodiment and that using a digital binary modulation scheme is provided for exemplary purposes only. In the first step (step 210), a length or total number of signals per codeword is determined based on the characteristics of the communications channel and the number of symbols in the alphabet. One example of a characteristic of the communications channel used in determining the length is the minimum bit period $t_b$ for distinguishing a given data signal at a receiver. For example, the length of the codewords may be determined by satisfying the following equations $2^L \geq C$, $L \leq 1/(mt_b)$, and $1/t_b \leq W_{max}$, wherein C represents the number of symbols in the alphabet needing to be transmitted, L is the length of the codewords, m is the minimum number of symbols per second to be transmitted as determined by the requirements of the system design, and $W_{max}$ is the maximum allowable bandwidth.

Based on the length, a set of codewords is produced (step 220). For example, if the length is determined to be 4 and the transmitter performs on-off keying the codewords would consist of {0000, 0001, 0010, 0011, 0100, 0101, 0110, 0111, 1000, 1001, 1010, 1011, 1100, 1101, 1110, and 1111}. In alternative embodiments, the transmitter may be capable of producing data signals with different energy levels and therefore different codewords would be produced as explained below.

The final step is producing a mapping between source symbols and codewords (step 230). Each source symbol has a known probability of occurrence which is predetermined. A mapping is then provided such that each symbol is associated with a codeword so that each symbol of lower probability is associated with a codeword of at least equal energy. For example, using the codewords presented above, the order from highest energy level to lowest energy level is 1111, 1110, 1101, 1011, 0111, 1100, 1010, 1001, 0110, 0101, 0011, 1000, 0100, 0010, 0001, 0000. All codewords which have an equivalent amount of high bits require an equivalent amount of energy to be transmitted so that 0001, 0010, 0100, and 1000 are all of equivalent energy levels.

FIG. 3 shows an exemplary version of the mapping where the source symbols are placed in order of increasing probability while the codewords are placed in order of decreasing energy levels. The codewords are then associated with the corresponding symbols as shown by the arrows.

The method as described may be extended to a noncoherent M-PAM constellation. For example, in a fixed length system, where the length is equal to 3 and the maximum energy level is 2 (where only positive data pulses are allowed) the total power consumed is provided in the table below. It should be understood that in other extended versions of this method that negative energy levels may be allowed.

| Power    | 0   | 1   | 2   | 3   | 4   | 5   | 6   | 8   | 9   | 12  |
|----------|-----|-----|-----|-----|-----|-----|-----|-----|-----|-----|
| Codeword | 000 | 001 | 011 | 111 | 002 | 012 | 112 | 022 | 122 | 222 |
|          |     | 010 | 101 |     | 020 | 102 | 121 | 202 | 212 |     |
|          |     | 100 | 110 |     | 200 | 120 | 211 | 220 | 221 |     |
|          |     |     |     |     |     | 021 |     |     |     |     |
|          |     |     |     |     |     | 210 |     |     |     |     |
|          |     |     |     |     |     | 201 |     |     |     |     |

In this example, the codewords 112, 121, 211 all consume an equal amount of energy which is equal to 6 units of energy. The total power consumed is provided by the equation $s_i = \Sigma_j s_{ij}^2$ where $s_{ij}$ is the energy level of one of the three components of the codeword and $s_i$ is the total power consumed for a codeword. The power consumed for codeword 112 is therefore $1^2+1^2+2^2=6$. By placing the codewords into increasing order of power consumption, the code words may be readily mapped to symbols of decreasing probability. The codewords may then be transmitted to a receiver which decodes the codewords back into the source symbols. In one embodiment, the receiver may have a look-up table in associated memory which contains a reverse mapping for the codewords and symbols. In an alternative embodiment, the mapping may be created on-the-fly and then transmitted to the receiver prior to any of the codewords being transmitted. Other multilevel coding techniques may be combined with the power efficient communication protocol and are explained below.

Figure 4:
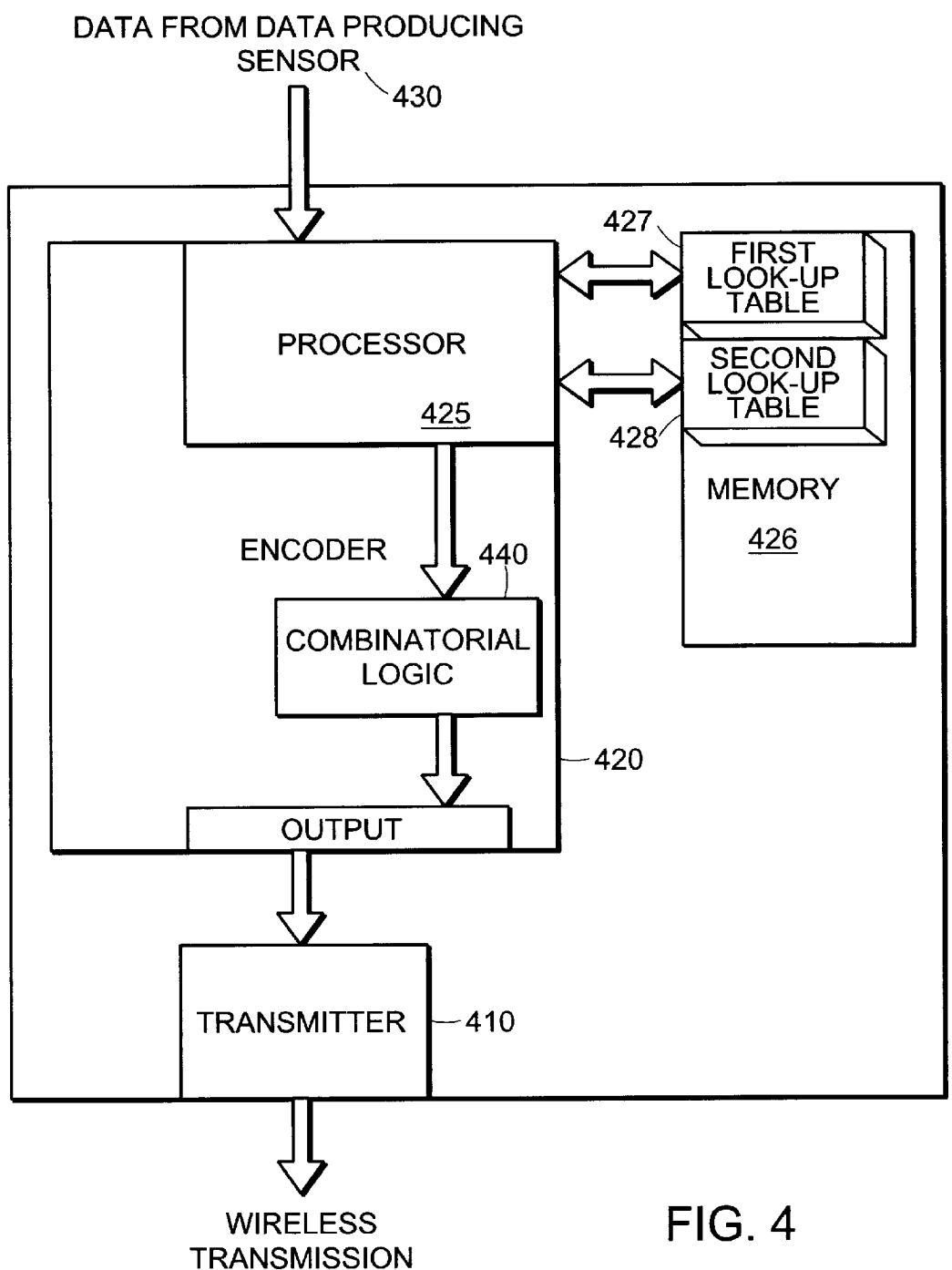
FIG. 4 shows a detailed view of one embodiment of the apparatus for encoding and transmitting the codewords.

FIG. 4 shows a detailed view of the apparatus for encoding and transmitting the codewords. The apparatus for telemetering data includes a transmitter 410 and an encoder 420. The encoder further includes a processor 425 with associated memory 426 which may be either Read-Only Memory (ROM) or Random Access Memory (RAM). The memory may also include a first and a second look-up tables 427, 428.

Figure 5:
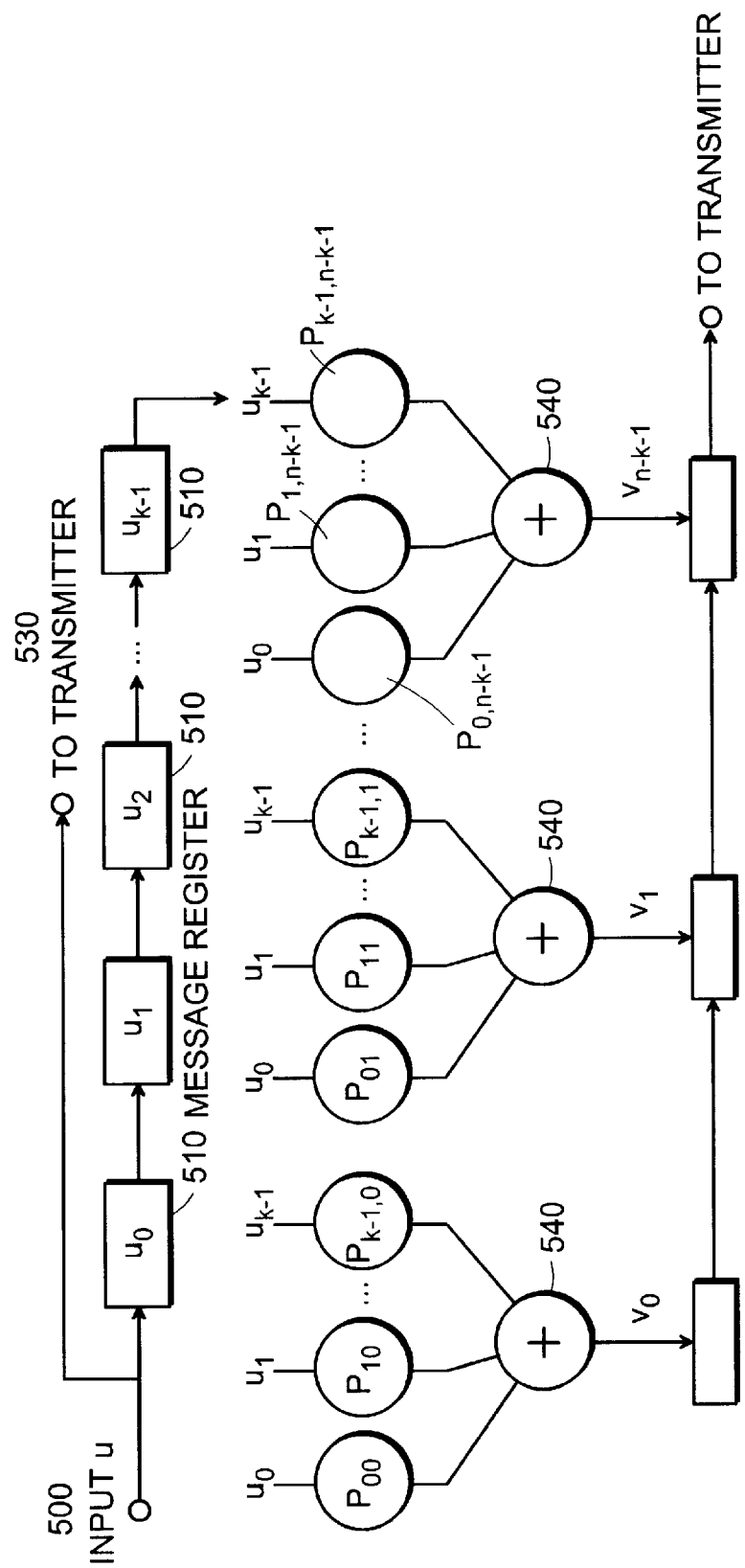
FIG. 5 shows an implementation of a combinatorial logic circuit.

The processor 425 has a parser which parses the received data from the data producing device 430 into a predetermined fixed length sequence. The processor accesses the first look-up table 427 which contains a listing of all of the symbols in a predefined alphabet. The processor compares each parsed section of the data with the alphabet in the look-up table 427 and identifies the symbol which corresponds with the data. The second look-up table 428 contains a mapping of the symbols with codewords which is accessed by the processor 425 as the symbols are identified. If the power efficient communication protocol is combined with a linear error correcting code, the encoder may further includes a combinatorial logic circuit 440 for generating the codewords to be transmitted. The combinatorial logic circuit which is shown in FIG. 5 operates in the following manner. An information bit sequence 500 to be encoded is shifted into a message shift register 510 and simultaneously into the transmitter 530. When the complete message enters the message register, parity check digits are formed at the output of the modulo-2 adders 540. These parity check digits are then serialized and shifted into the channel and combined with the codewords to form error correctable codewords.

The transmitter of FIG. 4 is selected to perform a defined modulation scheme such as on/off keying for binary representation, binary phase shift keying (BPSK) modulation or other modulation techniques including pulse amplitude modulation (M-PAM) and quadrature amplitude modulation (M-QAM). In on/off keying, the transmitter modulates the codewords onto a carrier wave. In a binary transmission, a high bit having a digital representation of 1 may be represented as a sine wave where a 0 or low bit requires no transmitted signal. The transmitter then transmits the carrier wave to a receiver. Other modulation techniques applied in conjunction with the power efficient communication protocol are discussed below. In alternative embodiments the first look-up table 427 may directly map the parsed data sequence to a codeword wherein the second look-up table 428 would be unnecessary for binary transmission. In the case of multi-level transmission, the second look-up table 428 provides a mapping between codewords and points of a signal constellation.

Figure 6:
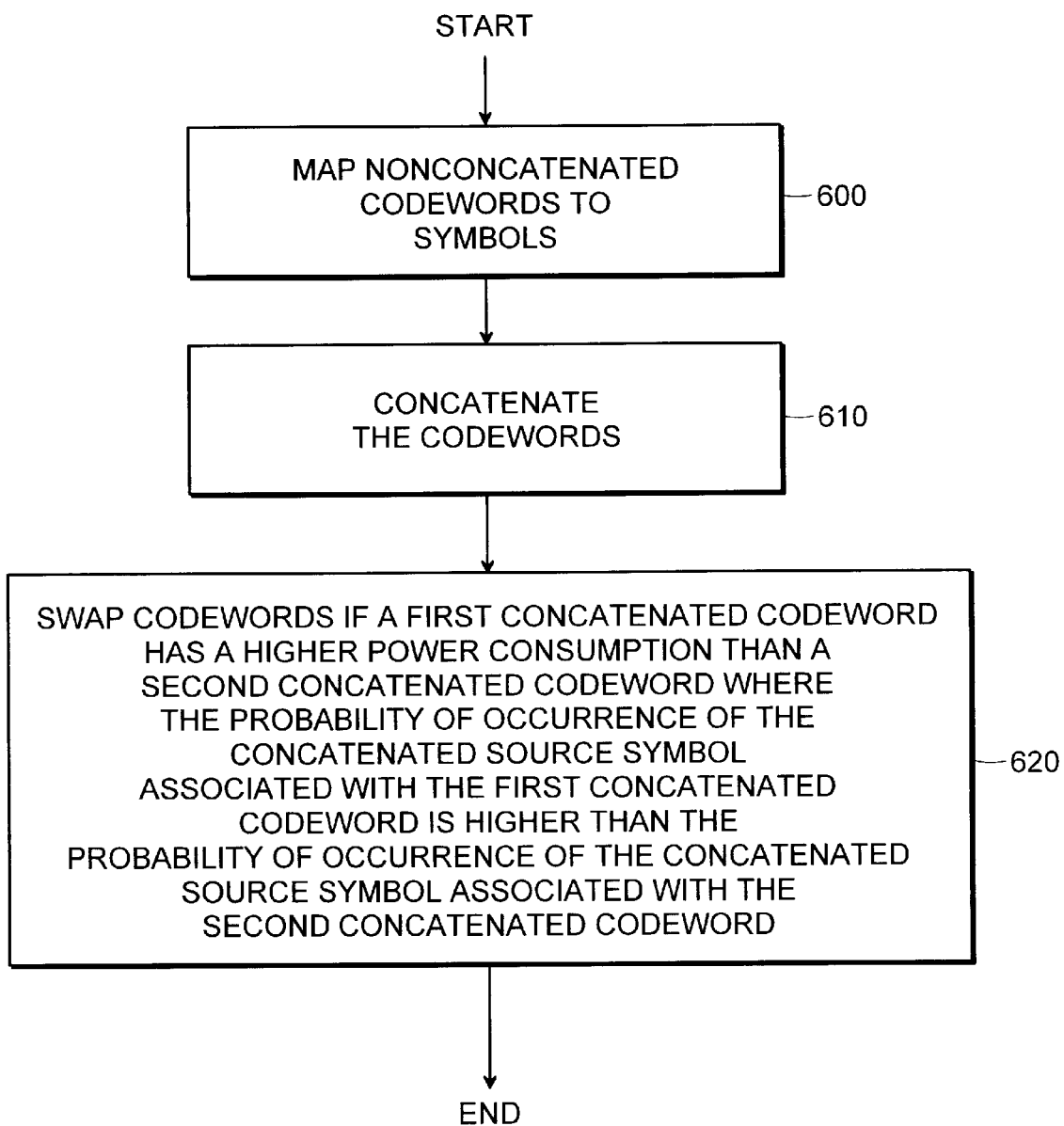
FIG. 6 shows a flow chart of the steps in which concatenation is combined with the power efficient communication protocol.

In yet another embodiment, the power efficient communication scheme may be combined with concatenation as shown in the flow chart of FIG. 6. Concatenation improves the energy efficiency by combining two or more codewords into a single codeword. First the non-concatenated codewords are mapped to symbols with predetermined probabilities such that symbols of higher probability are mapped to codewords of lower energy consumption levels as explained above (step 600). Once the codewords are set concatenation of the codewords may occur. For example the code words 001 and 010 would be directly concatenated into 001010. If the probability of 001 was 0.4 and the probability of 010 was 0.3 then the concatenated probability would be 0.12 (step 610). Repeating this process for every pair of codewords yields a set of directly concatenated codewords along with the concatenated probabilities. To optimize the codewords the codeword assignments are swapped if there is a concatenated codeword with a higher probability with a higher energy level than another a concatenated code word which has a lower energy consumption level and lower associated probability(Step 620). This swapping occurs for all concatenated codewords until this condition no longer exists.

Figure 7:
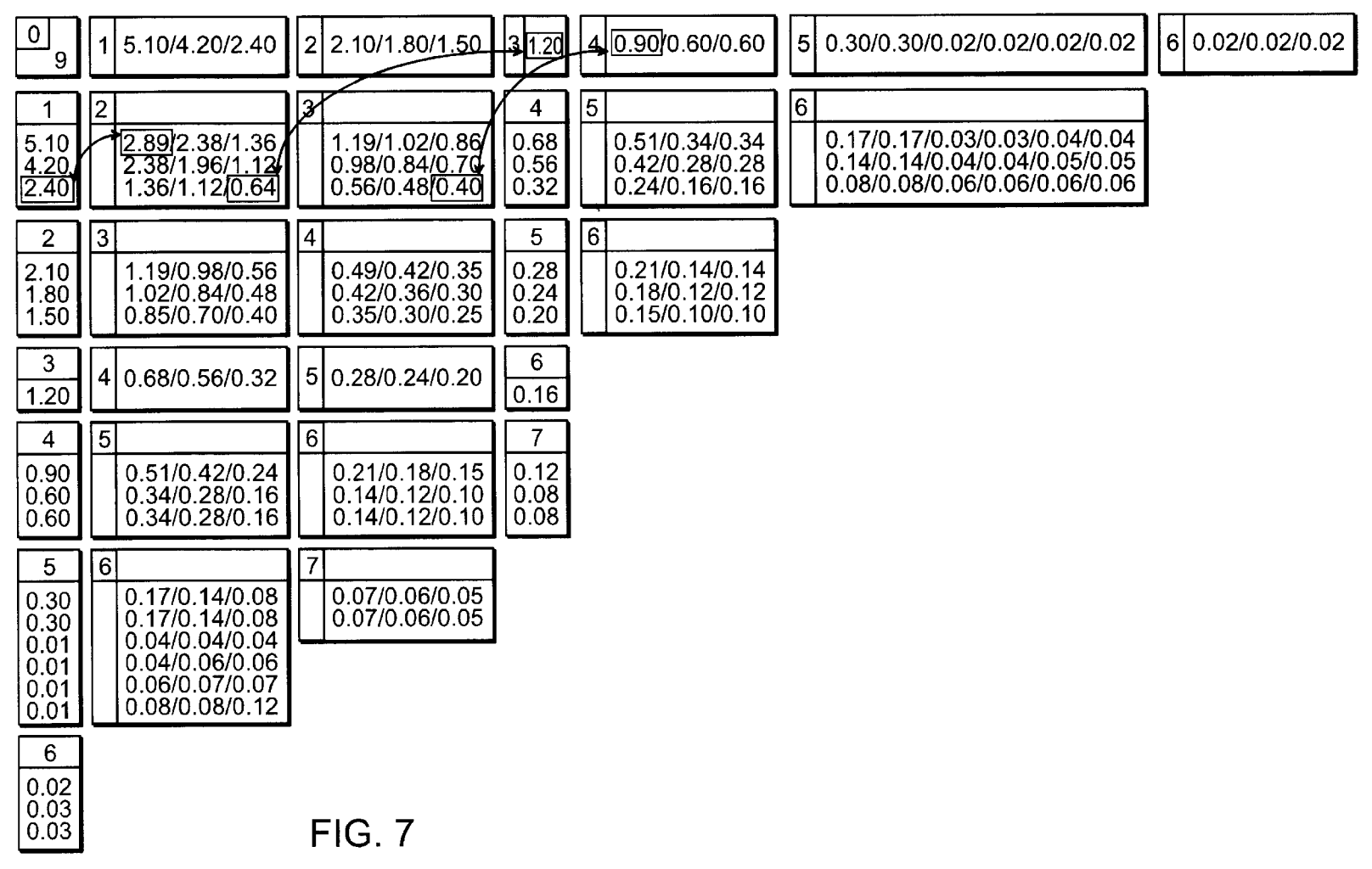

FIG. 7 shows a table which in the upper left hand corner of each box indicates the energy consumption level of the corresponding codewords and the remaining numbers equal the probabilities of all concatenated codewords having that energy consumption level in percentages. As can be seen from the first column having a codeword with a energy consumption level of 1 that the percentage of 2.4 percent is actually lower than the percentage of 2.89 for a codeword with an energy consumption level of 2. As indicated by the arrows the codewords are switched to optimize the energy efficient coding. By swapping the codewords an optimal concatenated power efficient code is created. Once the code is determined the codewords can be stored in a lookup table for use when a data producing device sends data to the processor of the encoder as discussed with respect to FIG. 4. In another embodiment of the invention concatenated codewords may be implemented by first determining the probabilities of the concatenated source symbols and then creating a mapping between the concatenated source symbols and the concatenated codewords so that each concatenated symbol of lower probability of occurrence is associated with a concatenated codeword of at least equal energy. The concatenated codewords are therefore associated to the concatenated symbols by placing the concatenated codewords into an order from highest energy consumption to lowest energy consumption and the concatenated source symbols into an order from lowest probability of occurrence to highest probability of occurrence and then directly relating the symbols to the codewords as similarly done with respect to FIG. 3. The probabilities may be determined through standard theoretical modeling techniques or through sample testings.

Figure 8:
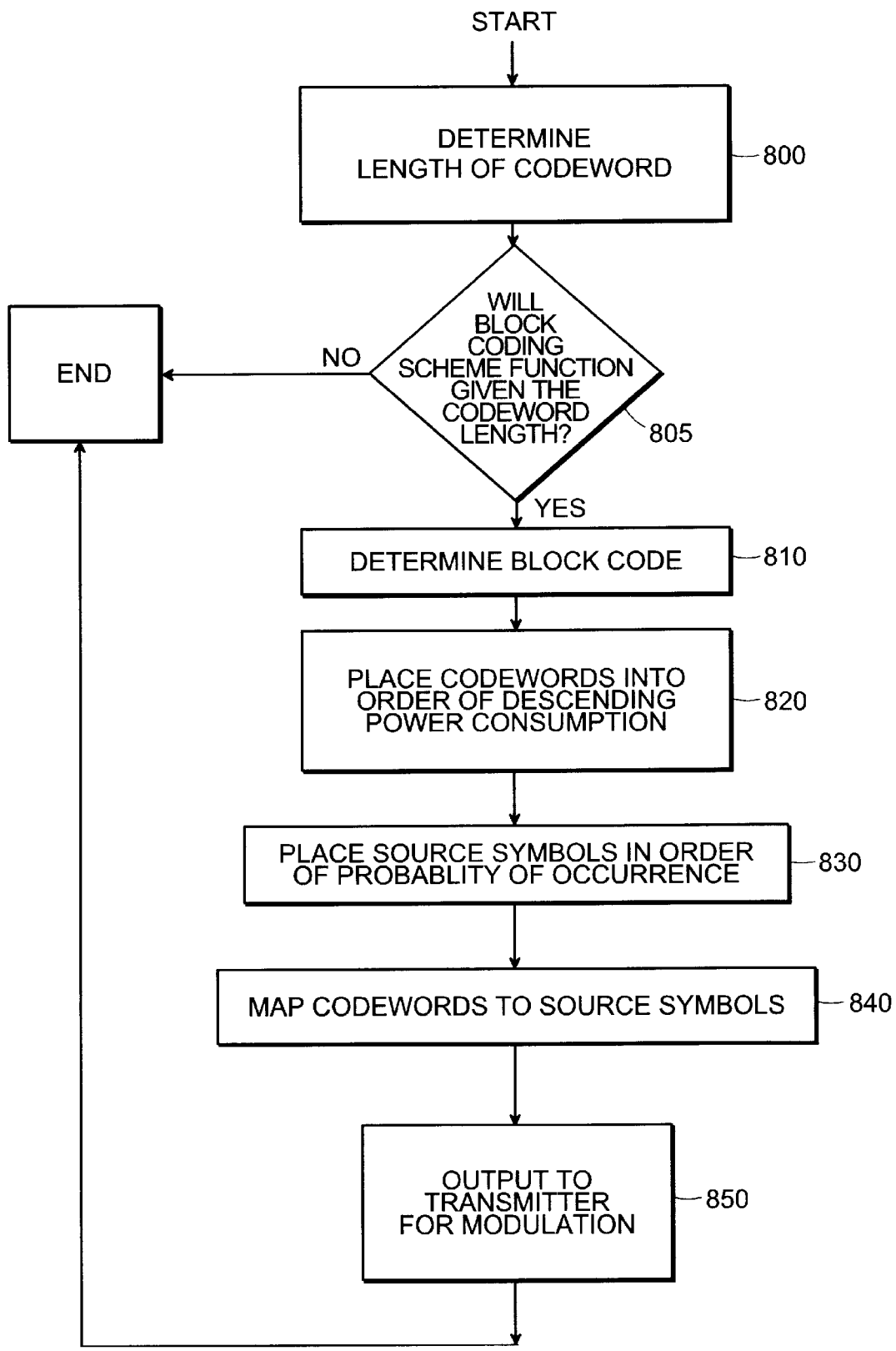
FIG. 8 shows a flowchart of the steps taken in applying the energy efficient communication protocols to linear error correcting block coding schemes.

FIG. 8 shows a flowchart of the steps taken in applying the energy efficient communication protocols to linear block coding schemes, including Hamming codes, Golay codes, Reed-Muller codes, Reed-Solomon codes, BCH, zero tail convolutional codes, tail-biting convolutional codes and Cyclic codes. Error correcting block coding schemes add one or more parity bits to blocks of message bits to make codewords. Coding techniques including those mentioned are known to those of ordinary skill in the art and are further described in Lin and Costello Jr., *Error Control Coding: Fundamentals and Applications*, Prentice Hall (1983) which is incorporated by reference herein in its entirety. The parity bits allow forward error correction that enable a limited number of errors to be detected and corrected without retransmission. Ideally the more parity bits that are added to the codewords the more errors that can be detected. In step 800, the length of the codewords are determined based upon the number of symbols within an alphabet which are to be encoded. A determination is then made as to whether the particular block coding scheme will function appropriately with the given alphabet and system design in step 805. If the length including the parity bit(s) for the codewords ($L_p$) multiplied by the system design requirement of the number of codewords required to be transmitted per second (SysReq) is less than or equal to the maximum data rate per second for the channel (sysCap) then the block coding scheme may be applied. This can be more readily understood by the following equation $(L_p)(SysReq) \leq (sysCap)$. SysCap may be determined based upon the channel constraints of bandwidth and spectral efficiency. In step 810, if it is determined that the system requirements are met, the block code is determined based in part on the length of the codewords determined in step 800. In the case of Hamming codes, the total length of the final codewords includes the number of error correcting bits along with the data carrying bits. The total length is used to calculate a Hamming generation matrix for determining the codewords. The act of constructing a construction matrix for a Hamming code is known to one of ordinary skill in the art. In step 820, the codewords are placed into order of descending power consumption levels. In step 830 the source symbols are placed in order of ascending probability of occurrence. The ordering of the codewords and the source symbols may be accomplished through standard database techniques for sorting, for example a bubble sort. In step 840, the codewords and the source symbols are mapped such that lower energy consumption level codewords are associated with higher probability source symbols. In step 850, the codewords are output to a transmitter for modulation and transmission across a channel. At the receiver side, the receiver demodulates the encoded codewords, the codewords are decoded and checked for errors. In the case of a Hamming code, a parity check matrix is constructed and the codewords are multiplied by the parity check matrix. Errors may be found from the result of this multiplication and corrected. Once the codewords are corrected the receiver may access a look-up table to determine the source symbol that corresponds with a particular codeword. In an alternative embodiment, the codewords are not corrected for errors, but rather the parity bits are used for error detection at the receiver. The receiver then sends a message back to the transmitter indicating that there was an error and that the codeword should be retransmitted. The flow chart of FIG. 8 may also be applied to energy burst error-correcting schemes such as concatenated codes, interleaved codes, product codes, fire codes, low density parity check codes, and various other coding schemes known in the art. These codes are known to those of ordinary skill in the art and may be found in such references as R. G. Gallag, *Low Density Parity Check Codes*, MIT Press (1963), G. D. Forney Jr *Concatenated Codes*, MIT Press (1966) which are incorporated by reference in their entirety.

Figure 9:
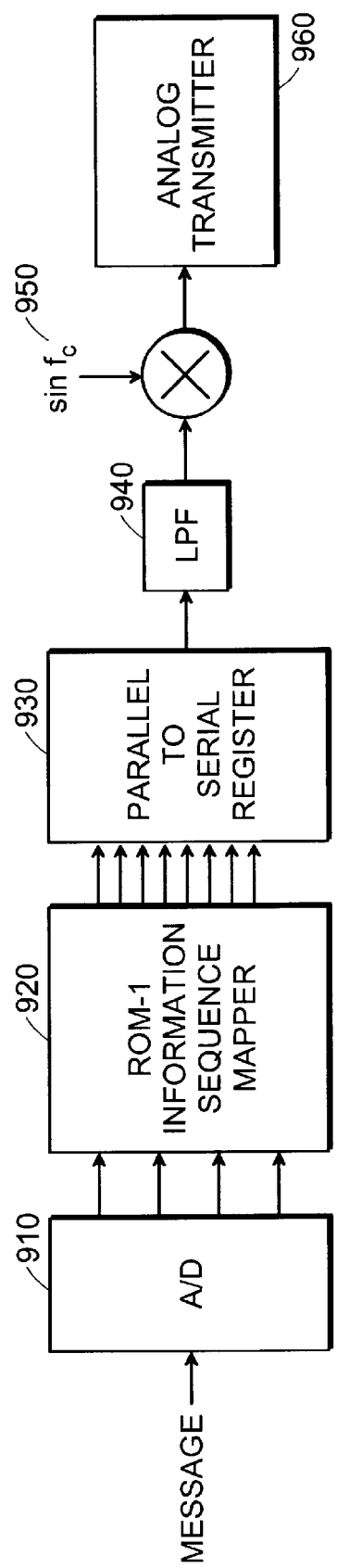
FIG. 9 shows an example of a hardware implementation for block codes using binary modulation.

The method described above in relation to FIG. 8 may be implemented in either hardware or software. The codes may be implemented in software by using a look-up table as described above. An example of a hardware implementation is shown in FIG. 9. An analog data message is converted to digital data via an analog to digital (A/D) converter 910. The digital data is shifted out of the A/D converter 910 in parallel and fed into address lines of a Read-Only-Memory (ROM) 920 which contains a mapping between the digital representation of the source symbols and the codewords. The codewords of length L bits are shifted out in parallel and then in turn converted to serial format by passing the codewords through a parallel to serial register 930. The codewords are then filtered through a low pass filter (LPF) 940. The codewords are then placed on a sinusoidal carrier frequency 950 and passed to an analog transmitter 960 for sending the sinusoidal encoded signal.

Figure 10A:
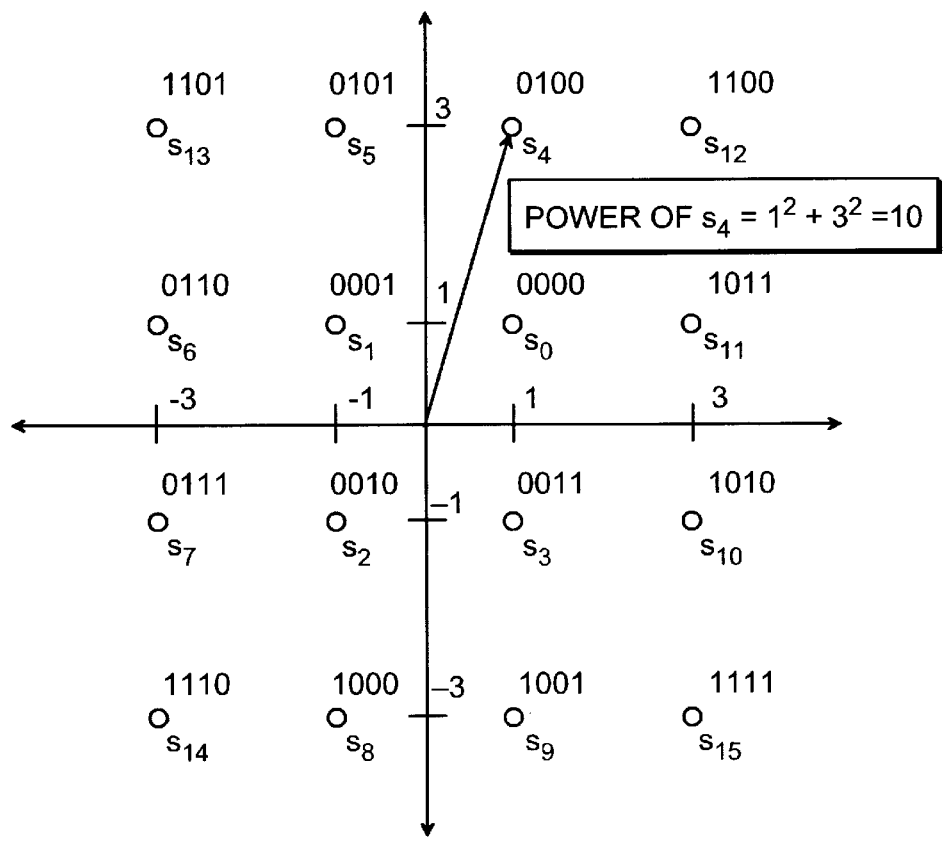
FIG. 10A shows the corresponding signal constellation for the codewords of FIG. 10.

The power efficient communication protocol may be implemented in conjunction with an uncoded multilevel modulation scheme. For an uncoded multilevel energy wireless transmission over a band-limited channel a signal constellation of M signals is selected based upon device limitations such as the maximum power of transmission. The constellation may be a pulse amplitude modulation (PAM) scheme, a quadrature amplitude modulation scheme (QAM) or any other multi-level energy modulation scheme. Given a constraint on the bandwidth $W_{max}$ based upon the physical characteristics of the transmission channel the minimum allowable signal duration is calculated such that the duration $T>1/W_{max}$. Given a minimum spectral efficiency constraint $\rho$, a value for the maximum allowable symbol sequence length N/2 (for a 2 dimensional constellation, and N for a 1 dimensional constellation) is selected based upon the equation $2 \log_2 M/N \geq \rho_{min}$. Data to be transmitted is received in an encoder and the data is parsed so that the length of each word is $\log_2 M$ bits in length. The resulting symbols of length $\log_2 M$ are mapped to the M signals of the constellation in a one-to-one manner in any order. For example the mapping might be done by means of Gray Coding. Once the symbols are mapped a usable codebook of $2^{(N/2)(\log 2M)}$ codewords is created where each $(N/2)(\log_2 M)$ bits correspond to a symbol sequence of length N/2. This mapping enumerates the whole set of possible sequences of signals of length N chosen from the signal set of log2 M points. The codewords are sorted in ascending order of power consumption. The first q, minimum energy codewords, are selected so that q is equivalent to the number of symbols. Codewords consuming more power are assigned to symbols with less probability. For example, given that there are 40 symbols with known probabilities of occurrence the symbols are ordered in order of increasing probability. If the coding constellation is QAM and M=16 and N is determined to be equal to 4, each one of the M signal points is assigned 4 information bits. The signals are ordered so that each of the N/2 signals corresponds to a code word of 8 bits. The codewords for the uncoded multilevel modulation scheme are shown in FIG. 10 and FIG. 10A shows the corresponding signal constellation. The first 40 codewords are selected to generate the minimum codebook and then codewords consuming less power are assigned to symbols with a higher probability. This multilevel coding algorithm can be applied to any M-ary constellation.

The power efficient communication protocol may also be implemented in conjunction with another set of codes known as Lattice codes. Lattice codes are understood by those of ordinary skill in the art and are further explained in Conway and Sloan, *Sphere Packings Lattices and Groups*, Springer (3rd. Edition 1999) which is incorporated by reference herein in its entirety. Furthermore, U.S. Pat. No. 4,630,288 entitled Data Transmission with Block Coding and U.S. Pat. No. 4,733,401 entitled Block Coding into 24 Coordinates and Detection of Transmitted Signals demonstrate two Lattice code modems, one of 8 dimensions and the other of 24 dimensions. Both patents are incorporated by reference herein in their entirety. The first step in power efficient lattice coding is choosing the dimension of the lattice code I.E. the number N for the N-tuple of the code. The size of the lattice N should be larger than the number of source symbols that are to be transmitted. The lattice N-tuples can then be configured using techniques known in the art. Once the N-tuples are determined then the N-tuple whose values define the lowest power consumption is associated with a symbol having the highest predetermined probability of occurrence. Each N-tuple having a different power consumption is said to be on a different shell level. Thus N-tuples with increasing energy levels are associated with symbols of decreasing probability in a similar fashion to the association presented in FIG. 3.

Figure 11:
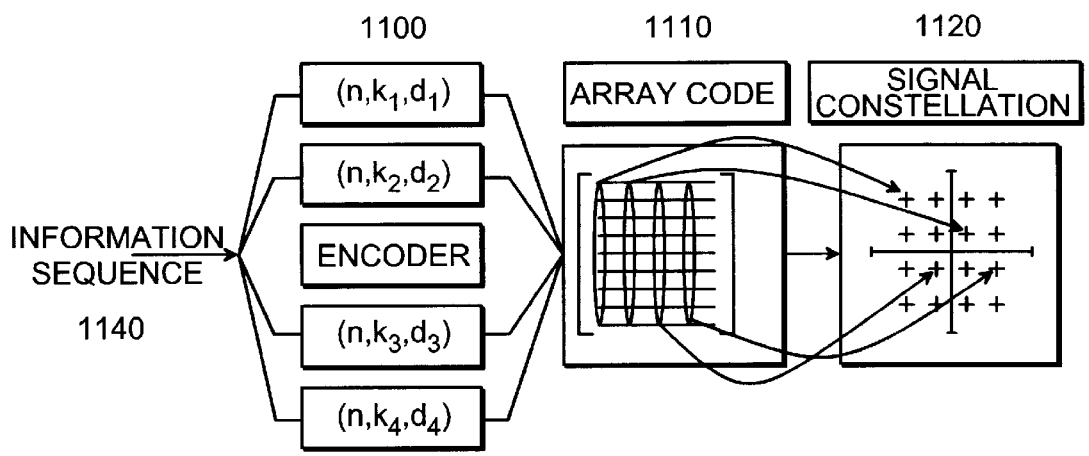
FIG. 11 shows a generalized diagram of a block-coded modulation implementation.

Block-coded modulation maps data signals to points taken from a signal constellation and are known to those of ordinary skill in the art and are described in such texts such as H. Imai and S. Hirakawa, *A New Multilevel Coding Method Using Error-Correcting Codes*, IEEE Transactions on Information Theory, IT-23(3):371–377 (1977), S. I Sayegh, *A Class of Optimum Block Codes in Signal Space*, IEEE Transactions on Communications, Com-34(10): 1043–1045, (October 1986), and U.S. Pat. No. 4,882,733 to Tanner all of which are incorporated by reference herein in their entirety. Block-coded modulation schemes create codeword arrays 1110 where the columns of the arrays are mapped to signal points from a signal constellation 1120. Thus, sequences of columns of the array codewords correspond to sequences of transmitted data pulses as shown in FIG. 11. The rows of the array codewords are each taken from block codes of a given length. The block codes can be of different data sequence length and different error correction capability, but have the same codeword length. The array columns are then mapped to points on the signal constellation. An example of a mapping scheme is Ungerboeck set partitioning. The respective points within the signal constellation require a defined amount of energy for transmission.

By creating a look-up table or ROM preceding the encoder shown in FIG. 10 the efficient power communication protocol may be implemented in conjunction with block-coded modulation. The look-up table may be created in the following fashion. A set of all possible array codewords is constructed along with the corresponding sequences of transmission symbols for an encoder 1100 which creates block codes. Since each symbol sequence entering the encoder is mapped to a different array codeword 1110 and each array codeword is mapped to a signal constellation 1120 having a predefined power consumption, the mapping of the entering symbol sequences 1140 which have a predetermined probability of occurrence may be mapped to array codewords based on the resulting power consumption of the resulting signal constellation mapping. The look-up table therefore relates information sequences which are representative of symbols in an alphabet having a high probability of occurrence with array codewords which result in signal sequences of a lower power consumption.

Figure 12:
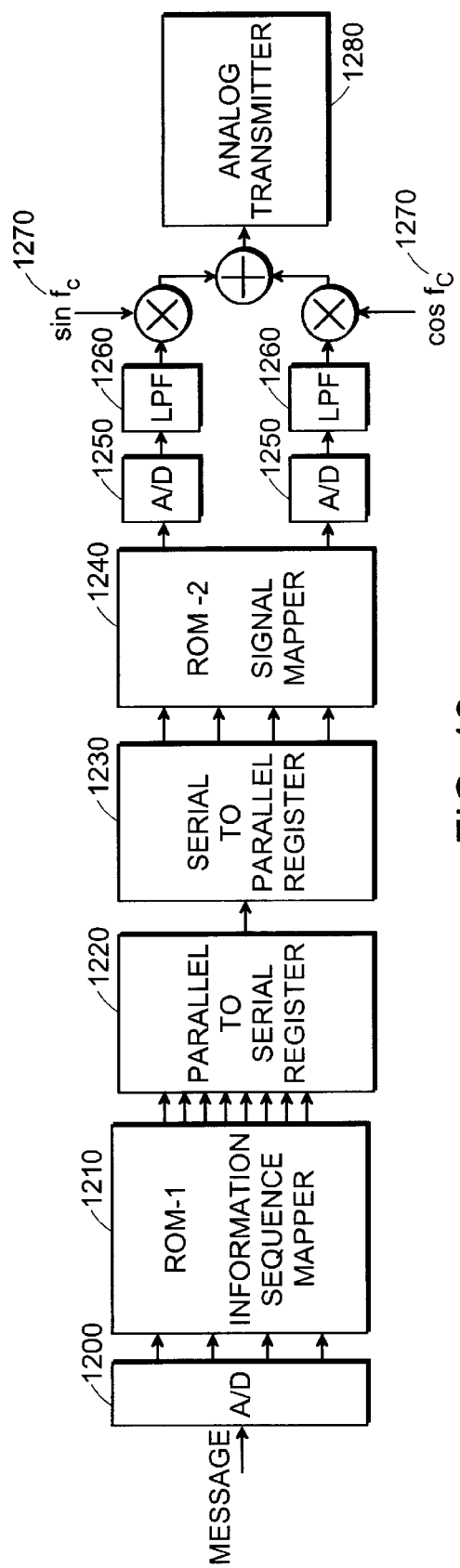
FIG. 12 shows an example of a hardware based implementation of the power efficient communication protocol in combination with a multi-level modulation scheme.

An example of a hardware based implementation of the power efficient communication protocol in combination with a digital block coded modulation scheme is shown in FIG. 12. Analog data is converted to digital data in an analog to digital (A/D) converter 1200. The digital data is shifted out of the A/D converter in parallel and fed into the address lines of a ROM chip 1210 containing a mapping between the digital representation of the data which are symbols in an alphabet and array codewords. This ROM is representative of the look-up table that precedes the encoder of FIG. 11. Once the array codewords are determined, the array codewords which have a length of L bits are shifted out in parallel and then in turn converted into serial format 1220. Then, a serial to parallel converter 1230 converts groups of $\log_2 M$ bits into a parallel format, since bit sequences of this length are used to select signal points from the constellation. The groups of $\log_2 M$ bits are equivalent to the columns of the codeword array discussed above and shown with respect to the encoder of FIG. 11. For example the value of L may be 12 bits which represent a 12 bit information sequence. In FIG. 11 where there are four encoders present there would be four rows of 12 bits. Assuming that a constellation with 16 constellation points is selected, each point needs 4-bits to represent one constellation point, thus the 1 bit of each of the four rows is transferred out in parallel form. Therefore, each 4 bit sequence is equivalent to shifting each column of the codeword array out column by column. These bit sequences are mapped to signal points of the constellation in a second ROM 1240. The second ROM 1240 performs the function of the arrows leading from the array code to the signal constellation in FIG. 11. The mapping is such that the memory contains a combination of certain coordinates (X, Y) which represent the amplitudes of the in-phase and quadrature components of the QAM signal. From the second ROM, the amplitude values for the X and Y coordinates are separated in parallel signal paths and analog values are generated by passing the amplitude signals through a digital-to-analog converter 1250. The resulting analog signal is low pass filtered 1260 and then coupled to the required signal 1270, which is either a cosine or a sine wave. The cosine and sine waves are then recombined to form the transmitted QAM waveform which is sent via an analog transmitter 1280.

In a further implementation, the power efficient communication protocol may be combined with trellis-coded modulation. Convolution codes and trellis coded modulation are known to those of ordinary skill in the art and is further explained in G. Ungerboeck, *Channel Coding with Multilevel/Phase Signals* IEEE Transactions on Information Theory, 28(1):55–67 (January 1981), G. Ungerboeck *Trellis Coded Modulation with Redundant Signal Sets part 1: Introduction*, IEEE Communication Magazine, 25(2):12–21 (February 1987), and H. H. Ma and J. K. Wolf, *On Tail Biting Convolution Codes*, IEEE Transactions on Communications, COM-34:104–111(February 1986) which are incorporated by reference herein in their entirety. First, the trellis code is found for a set of predetermined source symbols. In trellis coding, symbol sequences are represented by path labels through the trellis. Frequently, trellis paths are infinite and thus the source symbols are mapped to an infinite path which requires an infinite codeword. In order to apply trellis coding in combination with the power efficient communication protocol, the trellis code is converted to a fixed length block-code. Trellis codes may be converted to a block-code through various known techniques such as direct truncation, zero tail, tail biting, and generalized tail biting. Once the fixed length block code is determined, the source symbols of higher probability are mapped to the converted trellis code block codes of less power.

Figure 13:
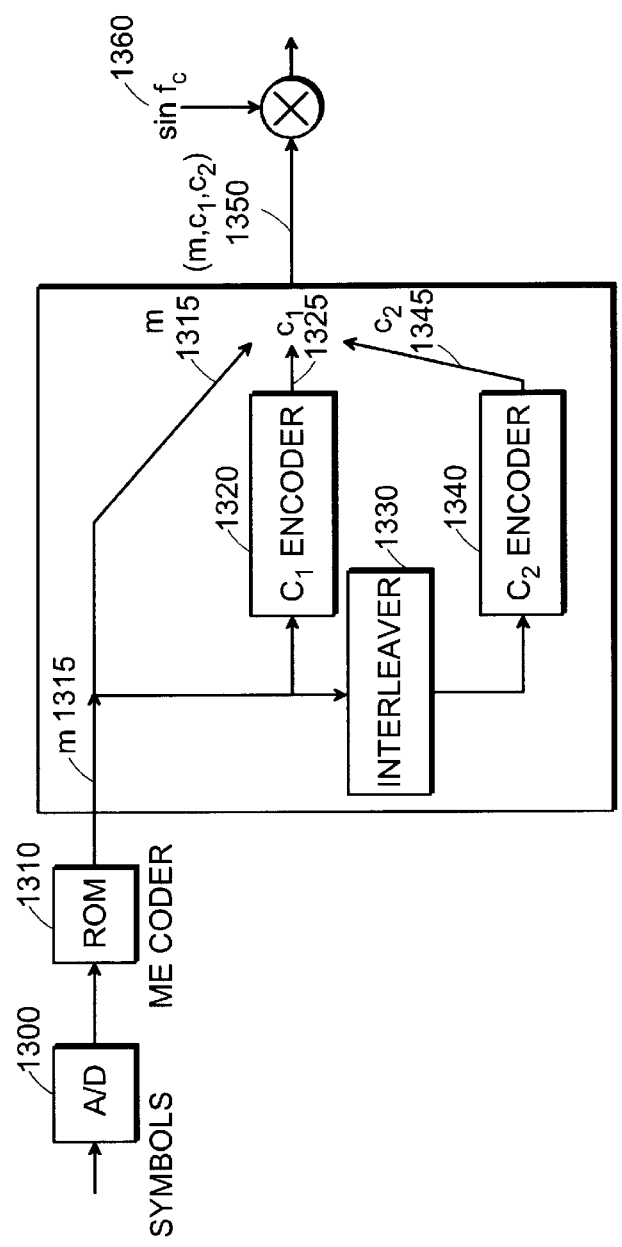
FIG. 13 shows a hardware implementation of the power efficient communication protocol in conjunction with a turbo encoder.

In FIG. 13 is shown one possible block diagram for an implementation of the power efficient communications protocol in combination with a turbo encoder. Turbo encoders and turbo encoding and decoding are known to those of ordinary skill in the art and may be found in such references as C. Berrou, A Glavieux and P. Thitimajshima *Near Shannon Limit Error-Correcting Coding and Decoding: Turbo Codes*, Proceedings of the 1993 International Conference on Communications, pg. 1064–70 (1993), and C. Heegard, S Wicker *Turbo Coding*, Kluwer Academic Publishers (1st Edition, 1999) which are incorporated by reference. An analog data stream from a data producing device enters an A/D converter 1300 converting the data into a digital format. In a ROM 1310 the digital data which has a predetermined associated probability of occurrence and has a predetermined length which defines a symbol is mapped to a codeword which produces a known turbo code of a predetermined energy. The mapping occurs such that the symbol having the highest probability of occurrence is mapped to the codeword which produces the turbo code of lowest energy. Each subsequent symbol is matched to a codeword in a similar fashion such that each symbol of lower probability is associated with a codeword of at least equal energy. After each symbol is mapped to a codeword, the codeword is passed out in serial fashion to the turbo encoder. The turbo encoder receives the data sequence of the codewords which is a bit sequence of length m 1315. This information sequence is delivered directly to the transmitter circuitry. The bit stream m is also passed to an encoder $C_1$ 1320 that is a block encoder or a zero-tail or tail-biting convolutional encoder that produces a $c_1$ bit codeword 1325 in response. The bit stream m is also passed to an interleaver 1330. The interleaver 1330 reorders the bit sequence for burst error correction. For instance the interleaver might be a block interleaver, a welch-costas interleaver, an algebraic interleaver, a Berrou Glavieux interleaver or other interleaver known in the art. The interleaved bit sequence is then fed into a second encoder $C_2$ 1340 that can be an encoder like $C_1$. $C_2$ produces a $c_2$ bit 1345 codeword in response. The combination of the three sequences (m, $c_1$, $c_2$) 1350 forms the codewords to be sent to the modulator. In the modulation section 1360, the combined sequence is modulated through binary modulation such as on-off keying.

With regards to any of the foregoing encoding techniques and encoders it should be understood by those of ordinary skill in the art that there may be a corresponding decoding technique and decoder which reverses the process of the encoder or encoding technique that is described such that the source symbols or original data sequence is produced at the receiver.

Figure 14:
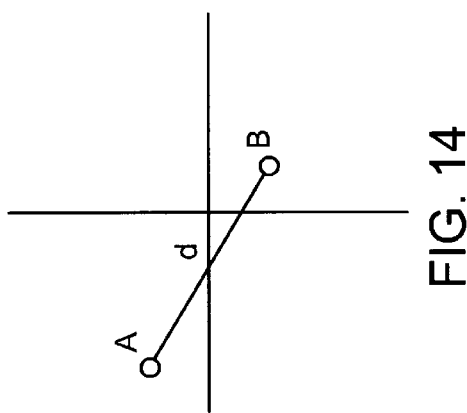
FIG. 14 shows two points in signal space.
Figure 14A:
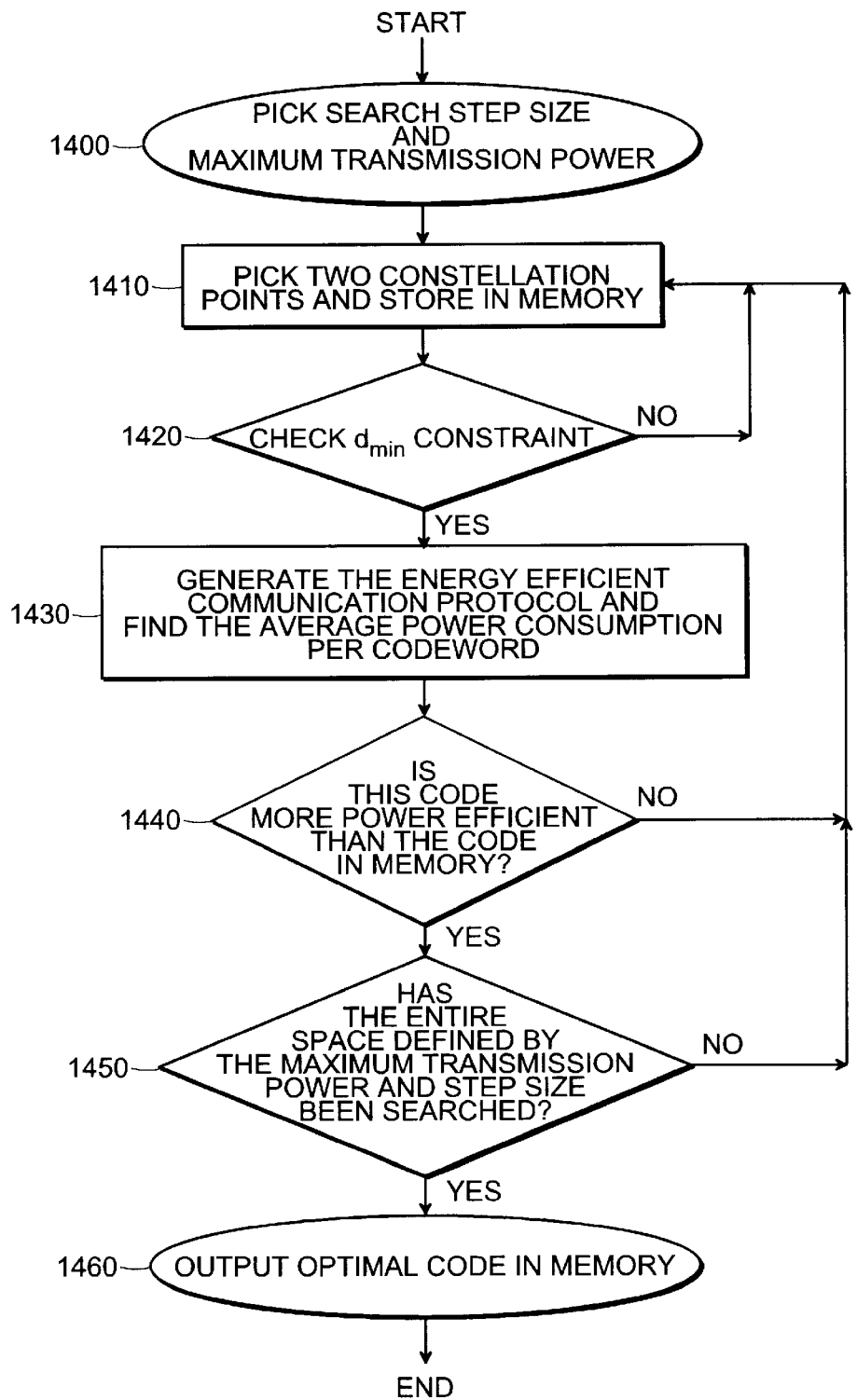
FIG. 14A is a flow chart of the steps for optimizing the selected points in signal space in combination with the power efficient communication protocol.

Choosing an optimum coding scheme without knowing the signal constellation beforehand is accomplished by the steps in the flow chart of FIG. 14A. For a binary coding scheme, the optimal coding and modulation scheme may be found by performing a search over the 2D signal space. Two such point A and B are shown in FIG. 14. The points are mapped to information bits such that A represents a 1 and B represents a 0. The points can have a minimum distance constraint $(Ax-Bx)2+(Ay-By)2>dmin$ and a maximum device transmit power constraint $Pmax>max((Ax2+Ay2), (Bx2+By2))$. The first step of the optimization algorithm is choosing a search step size and maximum power transmission (Step 1400). Next, two signal points are selected (Step 1410) and the points are checked for satisfaction of the constraints (Step 1420). If the selected points do not satisfy the constraints, another two points are selected. If the selected points do satisfy the constraints, then a codebook is generated, and finally an energy efficient mapping occurs. The average power per codeword and the location of two signal points (Ax, Ay) and (Bx, By) for this code are then stored in memory (Step 1430). Next, a new set of two signal points A' and B' are selected and the minimum distance constraint is checked and energy efficient coding is performed based upon the codewords of the codebook from the first two points. The average power per codeword for this code is compared with the one that is stored in memory (Step 1440). The signal points producing the code having less average power consumption per codeword is kept. The selection of signal points and average power per codeword comparison is continued until the whole 2D constellation space is searched with the given step size (Step 1450). After all points within the constellation are checked, then the memory contains the signal constellation points that will give the optimal energy code (Step 1460). For constellations containing multiple signal points, the coding method in multilevel uncoded modulation described previously can be combined with the search/optimization algorithm described above.

In an alternative embodiment, the disclosed apparatus and method for power efficient communication protocol may be implemented as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

Preferred embodiments of the present invention are described in the following pages. While the invention is described in detail herein, it is to be clearly understood that the same is by way of illustration and example and is not to be taken by way of limitation. Indeed, numerous variations and modifications will be apparent to those skilled in the art. While the description is provided in terms of binary bits, no limitation is to be inferred therefrom, and generalization to code alphabets of arbitrary symbol variation is within the scope of the claimed invention. All such variations and modifications are intended to be within the scope of the present invention as defined in the appended claims.

We claim:

1. A method for encoding data into codewords, the data comprising source symbols selected from an alphabet each codeword comprising a signal characterized by an energy, each source symbol characterized by a probability of occurrence, the method comprising:

determining a length for the codewords based at least on a total number of symbols in the alphabet to be coded;

creating a set of codewords based on the determined length; and producing a mapping at the transmitter between source symbols and codewords mapped such that each symbol of lower probability of occurrence relative to all other source symbols in the alphabet is associated with a codeword of higher or at least equal energy in comparison to each codeword associated with a source symbol having a greater probability of occurrence.

2. The method according to claim 1, wherein the step of determining requires satisfying inequalities $2^L \geq C$ and $L \leq 1/(mt_b)$;

wherein C represents the number of symbols, L is length of the codewords, m is number of symbols per second, and $t_b$ is a unit of time representative of a bit period.

3. The method according to claim 1, further comprising: transmitting codewords representative of symbols to a receiver.

4. The method according to claim 3, further comprising: modulating the codewords on a carrier wave.

5. The method according to claim 4, wherein in the step of modulating further comprises performing block-coded modulation wherein the codewords are mapped to a signal constellation.

6. The method according to claim 4, wherein in the step of modulating further comprises performing trellis-coded modulation wherein the codewords are mapped to a signal constellation.

7. A method for encoding data into codewords, each codeword comprising a sequence of signals and characterized by an energy, the data comprising source symbols, each source symbol characterized by a probability of occurrence, the method comprising:

determining a length for the codewords based at least on a number of concatenated symbols to be coded;

creating a set of codewords based on the determined length;

determining a probability of occurrence for multiple concatenated source symbols;

producing a mapping between the multiple concatenated source symbols and codewords mapped such that each concatenated symbol of lower probability of occurrence relative to all other concatenated symbols is associated with a codeword of higher or at least equal energy in comparison to each codeword associated with a concatenated symbol having a greater probability of occurrence.

8. A method for encoding data into codewords, each codeword comprising a sequence of signals, each codeword characterized by an energy, the data comprising at least one of a number of source symbols, each source symbol characterized by a probability of occurrence relative to all other source symbols in an alphabet, the method comprising:

constructing a set of codewords having a length based upon a coding scheme wherein the length of the codewords is constrained by the number of symbols and a given transmission rate for a channel; and producing a mapping between the source symbols and codewords mapped such that each symbol of lower probability of occurrence relative to all other source symbols in the alphabet is associated with a codeword of higher or at least equal energy in comparison to each codeword associated with a source symbol having a greater probability of occurrence.

9. The method according to claim 8, wherein the coding scheme is a Hamming code.

10. The method according to claim 9, wherein the Hamming code is extended to add a parity check bit.

11. The method according to claim 8, wherein the coding scheme is a Golay code.

12. The method according to claim 11, wherein the Golay code is extended to add a parity check bit.

13. The method according to claim 8, wherein the coding scheme is a turbo code.

14. The method according to claim 8, wherein the coding scheme is a Reed-Muller Code.

15. The method according to claim 8, wherein the sequence of signals have at least two levels of energy.

16. The method according to claim 8, further comprising: modulating the codewords using binary modulation.

17. The method according to claim 8, the codewords are defined by more than one discrete energy level.

18. The method according to claim 8, wherein the coding scheme is a block coding.

19. The method according to claim 8, wherein the coding scheme is burst error correction.

20. The method according to claim 8, wherein the coding scheme is convolution coding.

21. The method according to claim 8, wherein the coding scheme is trellis coding converted to a block code.

22. The method according to claim 8, wherein the coding scheme is a lattice code.

23. The method according to claim 8, wherein the coding scheme is error correction coding.

24. The method according to claim 8, wherein the coding scheme is a low density parity check code.

25. A computer program product for use on a computer system for encoding data into codewords, the data comprising source symbols selected from an alphabet each codeword comprising a signal characterized by an energy, each source symbol characterized by a probability of occurrence relative to all other source symbols in the alphabet, the computer program product comprising a computer usable medium having computer readable program code thereon, the computer readable program code including:

computer code for determining a length for the codewords based at least on a total number of symbols in the alphabet to be coded;

computer code for creating a set of codewords based on the determined length; and computer code for producing a mapping between source symbols and codewords mapped such that each symbol of lower probability of occurrence relative to all other source symbols in the alphabet is associated with a codeword of higher or at least equal energy in comparison to each codeword associated with a source symbol having a greater probability of occurrence.

26. The computer program product according to claim 25, wherein computer code for determining requires satisfying inequalities $2^L \geq C$ and $L \leq 1/(mt_b)$;

wherein C represents the number of symbols, L is length of the codewords, m is number of symbols per second, and $t_b$ is a unit of time representative of a bit period.

27. The computer program product according to claim 25, further comprising:

computer code for transmitting codewords representative of symbols to a receiver.

28. The computer program product according to claim 27, further comprising:

computer code for modulating the codewords on a carrier wave.

29. The computer program product according to claim 28, wherein the computer code for modulating further comprises performing block-coded modulation wherein the codewords are mapped to a signal constellation.

30. The computer program product according to claim 28, wherein the computer code for modulating further comprises performing trellis-coded modulation wherein the codewords are mapped to a signal constellation.

31. A computer program product for use on a computer system for encoding data into codewords, each codeword comprising a sequence of signals and characterized by an energy, the data comprising source symbols, each source symbol characterized by a probability of occurrence relative to all other symbols in an alphabet, the computer program product comprising a computer usable medium having computer readable program code thereon, the computer readable program code including: the method comprising:

computer code for determining a length for the codewords based at least on a number of concatenated symbols to be coded;

computer code for creating a set of codewords based on the determined length;

computer code for determining a probability of occurrence for multiple concatenated source symbols based on the probability of occurrence of each source symbol relative to all other symbols in the alphabet; and computer code for producing a mapping between the multiple concatenated source symbols and codewords mapped such that each concatenated symbol of lower probability of occurrence relative to all other concatenated symbols is associated with a codeword of higher or at least equal energy in comparison to each codeword associated with a concatenated symbol having a greater probability of occurrence.

32. A computer program product for use on a computer system for encoding data into codewords, each codeword comprising a sequence of signals, each codeword characterized by an energy, the data comprising at least one of a number of source symbols, each source symbol characterized by a probability of occurrence relative to all other source symbols in an alphabet, the computer program product comprising a computer usable medium having computer readable program code thereon, the computer readable program code including:

computer code for constructing a set of codewords having a length based upon a coding scheme wherein the length of the codewords is constrained by a given transmission rate for a channel; and computer code for producing a mapping between the source symbols and codewords mapped such that each symbol of lower probability of occurrence relative to all other source symbols in the alphabet is associated with a codeword of higher or at least equal energy in comparison to each codeword associated with a source symbol having a greater probability of occurrence.

33. The computer program product according to claim 32, wherein the coding scheme is a Hamming code.

34. The computer program product according to claim 33, wherein the Hamming code is extended to add a parity check bit.

35. The computer program product according to claim 32, wherein the coding scheme is a Golay code.

36. The computer program product according to claim 32, wherein the Golay code is extended to add a parity check bit.

37. The computer program product according to claim 32, wherein the coding scheme is a turbo code.

38. The computer program product according to claim 32, wherein the coding scheme is a Reed-Muller Code.

39. The computer program product according to claim 32, wherein the sequence of signals have at least two levels level of energy.

40. The computer program product according to claim 32, further comprising:

computer code for modulating the codewords using binary modulation.

41. The computer program product according to claim 32, wherein the codewords are defined by more than one discrete energy level.

42. The computer program product according to claim 32, wherein the coding scheme is block coding.

43. The computer program product according to claim 32, wherein the coding scheme is burst error correction.

44. The computer program product according to claim 32, wherein the coding scheme is convolution coding.

45. The computer program product according to claim 32, wherein the coding scheme is trellis coding converted to a block code.

46. The computer program product according to claim 32, wherein the coding scheme is a lattice code.

47. The computer program product according to claim 32, wherein the coding scheme is error correction coding.

48. The computer program product according to claim 32, wherein the coding scheme is a low density parity check code.

* * * * *